United States Patent [19]
Procureur

[11] Patent Number: 6,001,184
[45] Date of Patent: Dec. 14, 1999

[54] ON WAFER EVAPORATION INSTALLATION

[75] Inventor: Franck Procureur, Monnaie, France

[73] Assignee: SGS-Thomson Microelectronics S.A., Saint Genis, France

[21] Appl. No.: 08/767,792

[22] Filed: Dec. 17, 1996

[30] Foreign Application Priority Data

Dec. 27, 1995 [FR] France ................................. 95 15829

[51] Int. Cl.⁶ ............................................. C23C 16/00
[52] U.S. Cl. ........................... 118/730; 118/729; 118/715
[58] Field of Search .................... 118/730, 731, 118/723 VE, 723 EB

[56] References Cited

U.S. PATENT DOCUMENTS

| | | | |
|---|---|---|---|
| 3,643,625 | 2/1972 | Mahl ........................................ | 118/48 |
| 3,783,821 | 1/1974 | Dobson ................................... | 118/48 |
| 4,817,559 | 4/1989 | Ciparisso ................................ | 118/731 |

OTHER PUBLICATIONS

French Search Report from French Patent Application 95 15829, filed Dec. 27, 1995.
IBM Technical Disclosure Bulletin, vol. 26, No. 10B, Mar. 1984, New York, US, pp. 5604–5605 Anonymous: "Canted Tier Wafer Dome".
Patent Abstracts of Japan, vol. 006, No. 212 (P–151), Oct. 26, 1982 & JP–A–57 117188 (Tokyo Shibaura Denki KK).

Primary Examiner—R. Bruce Breneman
Assistant Examiner—Erin Fieler
Attorney, Agent, or Firm—Wolf, Greenfield & Sacks, P.C.

[57] ABSTRACT

This invention relates to an evaporation installation of the type including a frame rotatably hanging around a first vertical shaft and supporting at least three arms for receiving at least three concave supports of wafers to be processed, rotatably mounted around secondary shafts supported by the arms, the arms being inscribed in a cone which is coaxial to the first shaft so that the secondary shafts have a rotating motion in a plane perpendicular to the vertical shaft. The supports are disposed so as to overlap.

20 Claims, 3 Drawing Sheets

ON WAFER EVAPORATION INSTALLATION

BACKGROUND OF THE PRESENT INVENTION

1. Field of the Present Invention

This invention relates to an evaporation installation of the type generally used for the evaporation of materials on substrates. More particularly, the invention relates to depositions of metallic compounds on integrated circuits which are being manufactured from silicon wafers, although other types of substrates may be utilized.

2. Discussion of the Related Art

FIG. 1 schematically shows a conventional evaporation installation. Such an installation is formed by a vacuum chamber 1 within which three supports S1, S2 and S3 are arranged. Each bell-shaped support is formed by a concave surface, having a generally circular circumference, and includes a plurality of openings 2 for receiving the silicon wafers, the surfaces to be processed being directed towards the inside (the concavity) of the supports. In FIG. 1, only a few openings 2 of support S1 have been shown, but all supports include openings along their entire surface.

Each support S1, S2 and S3 is rotatably mounted on a shaft, respectively A1, A2, A3, perpendicular to its surface at its top. Shafts A1, A2, A3 are supported by a common suspension frame 3, which is itself rotatably mounted on a vertical main shaft 4 which is supported by an upper wall 5 of chamber 1. Frame 3 also supports arms P1, P2 and P3 at the free ends on which shafts A1, A2 and A3 are located. The rotating motion of frame 3 transmits, generally through bevel gears (not shown), a rotating motion to transmission shafts (not shown) contained in arms P1, P2, and P3 which transmit the rotating motion, by similar means, to shafts A1, A2 and A3. Supports S1, S2 and S3 are generally called "planet members" due to their eccentric respective motions. The internal surfaces of the supports are turned towards an evaporation source 6.

FIG. 2 is a developed view which shows the three supports S1, S2 and S3 in the same plane, each support being shown in a plane perpendicular to its axis of rotation. As shown by this drawing, supports S1, S2 and S3 are all rotated in the same direction. The rotating motions are indicated in FIGS. 1 and 2 by an arrow F1 for the rotation of frame 3 and by arrows F2 for the rotation of each support S1, S2 or S3 around their corresponding shafts A1, A2 or A3.

An evaporation cycle consists of loading chamber 1 with supports S1, S2 and S3 which support the wafers to be processed, performing a vacuum pumping of the inside of chamber 1, heating the internal space of chamber 1, energizing evaporation source 6 in order to cause a deposition, cooling down and ventilating the chamber, and extracting the supports. The rotating motions, transmitted to frame 3 and to supports S1, S2 and S3, ensure a uniform deposition on the surfaces to be processed. The operation of such an installation is known.

A problem which appears in this type of installation is linked with the duration of the evaporation cycle. In practice, for a conventional installation with three supports having a diameter of around one meter, a cycle has a duration of several hours from the loading to the unloading of chamber 1. The efficiency of such an installation, which is defined as the duration of a cycle for one wafer, is thus generally mediocre.

SUMMARY OF THE PRESENT INVENTION

The present invention is directed to providing an evaporation installation with an improved efficiency.

The present invention is also adapted for use with an existing installation.

The present invention is based on the observation that, for a given evaporation installation, the duration of the evaporation step itself is short with respect to the duration of the loading, vacuuming, temperature rise, cooling-down and ventilating steps. Hence, the present invention provides a overlapping of the supports to enable the processing in a single evaporation step of a larger number of wafers without modifying, the size of the chamber, the vacuum, the heating and ventilating means, or the evaporation source, and by providing at most only a slight modification of the supports and the arms. This results in an increase in the duration of the evaporation step itself without modifying the duration of the previous and former steps which, as has been indicated, are by far the longest.

More specifically, the present invention provides an evaporation installation of the type including a frame rotatably mounted to a first vertical shaft, the frame supporting at least three arms for receiving at least three concave supports of wafers to be processed. The at least three concave supports being rotatably mounted around secondary shafts which are supported by the arms, wherein the supports overlap.

According to an embodiment of the present invention, the axis of each support is inclined with a determined angle with respect to the radiuses of a circle defined by the tops of all the supports.

According to an embodiment of the present invention, the secondary shafts are regularly distributed, the circumference of each support being disposed in close relationship to the tops of the neighboring supports.

According to an embodiment of the present invention, the vertical shaft hangs from an upper wall of a chamber containing an evaporation source.

According to an embodiment of the present invention, the installation includes five supports.

The present invention also provides a method for increasing the processing capacity of an evaporation installation of the type including a frame rotatably mounted to a first vertical shaft connected to a plurality of arms supporting concave supports of wafers to be processed, the supports being rotatably mounted around secondary shafts, the arms being inscribed in a cone which is coaxial to the first shaft so that the secondary shafts have a circular motion in a plane substantially perpendicular to the vertical shaft, including replacing the first plurality of arms by a second plurality of arms such that the supports overlap.

According to an embodiment of the present invention, the axis of each support is inclined with a angle determined with respect to the radius of the circle defined by the tops of the supports.

BRIEF DESCRIPTION OF THE DRAWINGS

These objects, features and advantages, as well as others, of the present invention will be discussed in detail in the following description of specific embodiments, taken in conjunction with the following drawings, but not limited by them, in which.

For clarity, the schematic representations of the drawings are not to scale and the same components have been referred to by the same reference numerals in the different drawings.

DETAILED DESCRIPTION

Figure 1:
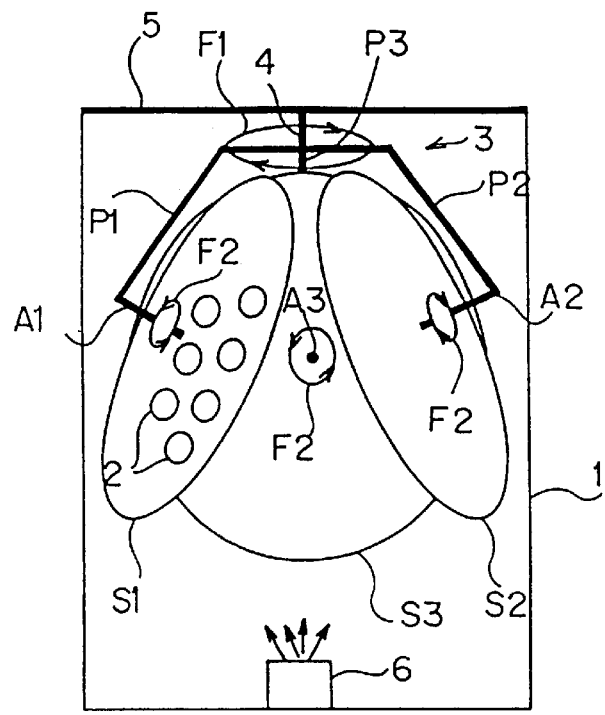
FIG. 1 shows an example of conventional evaporation installation.
Figure 2:
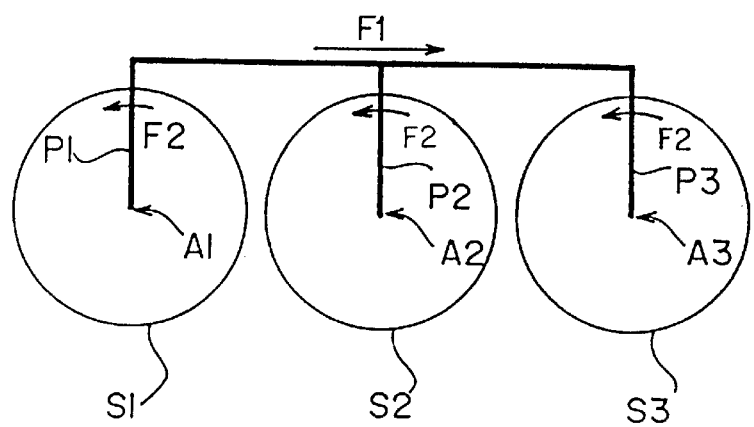
FIG. 2 shows a developed view of a conventional evaporation installation.
Figure 3:
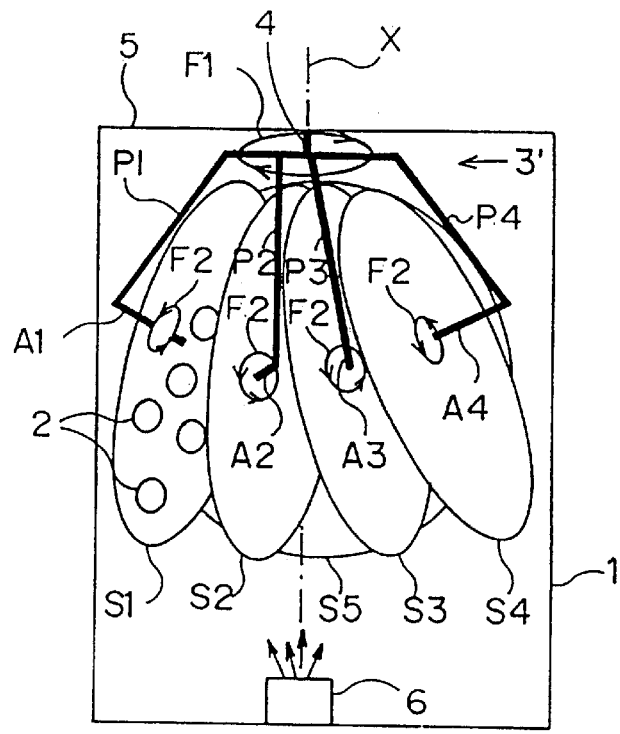
FIG. 3 shows an embodiment of an evaporation installation according to the present invention.
Figure 4:
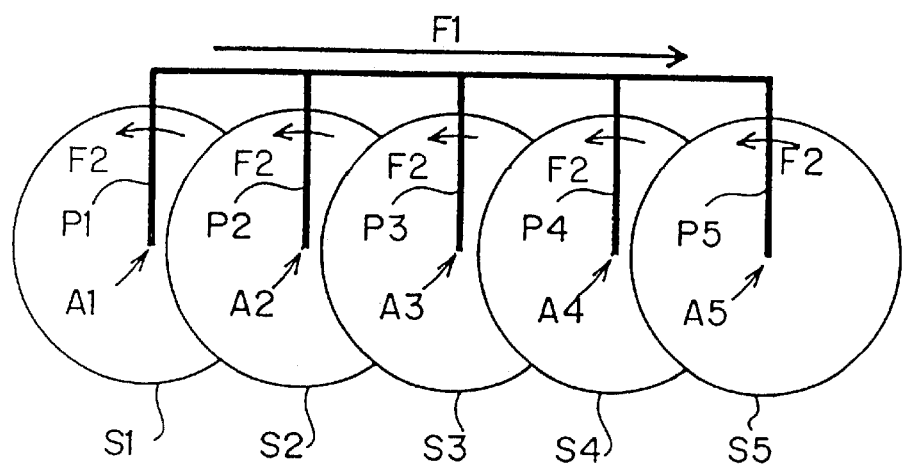
FIG. 4 is a developed view illustrating the motion of wafer supports according to the present invention.
Figure 5:
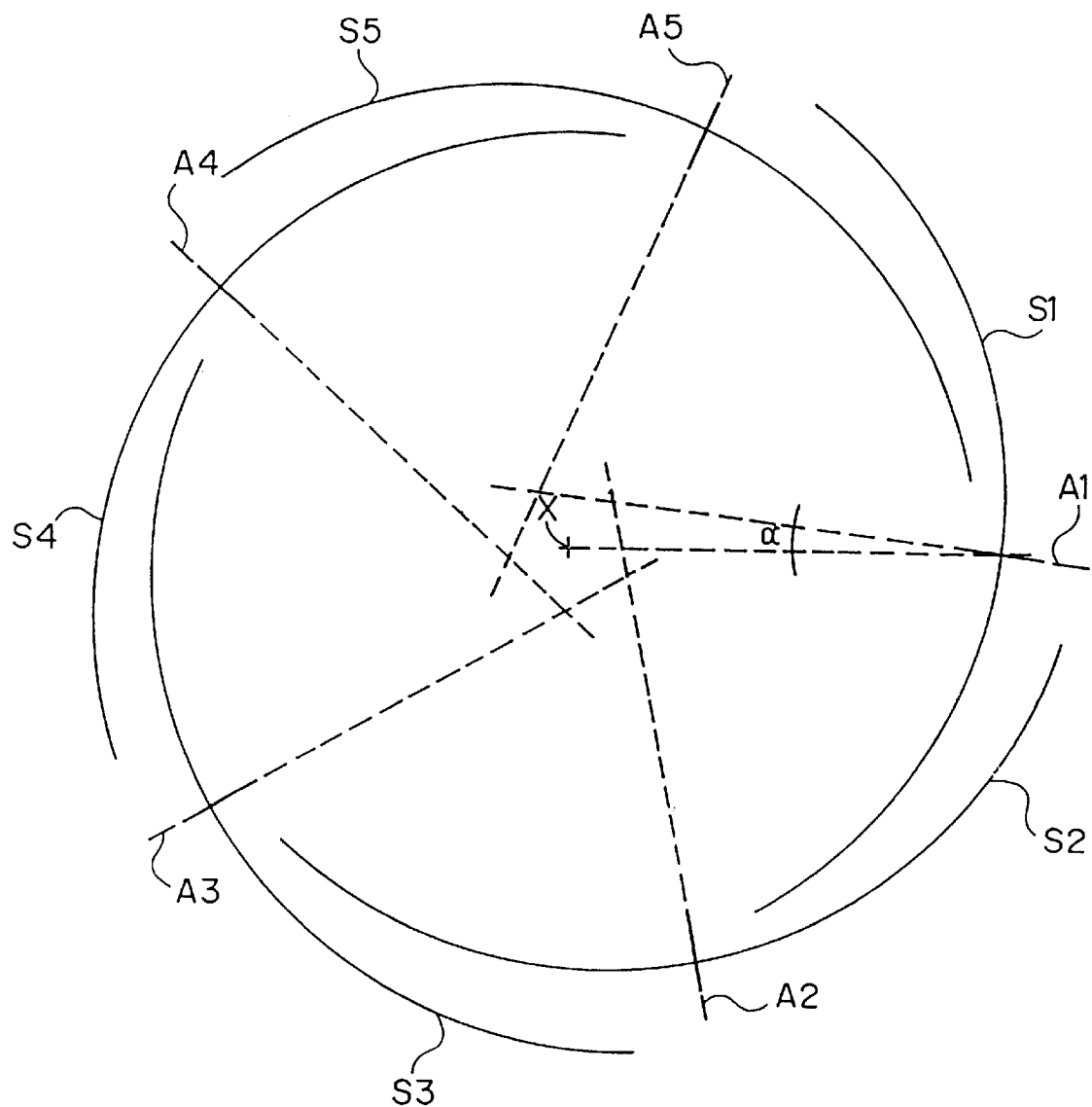
FIG. 5 shows a cross-sectional view in a plane defined by the tops of the supports.

An installation implementing the present invention is shown in FIGS. 3 to 5. FIG. 3 is a schematic front view. FIG. 4 shows a developed view of the supports in a view similar to FIG. 2 of the prior art. FIG. 5 shows a schematic cross-sectional view in a plane defined by the tops of the supports.

The installation includes a conventional chamber 1 provided with an evaporation source 6 and vacuum, heating, cooling down and ventilating systems (not shown). In the exemplary embodiment, a conventional chamber 1 provided for three supports or planet members S1–S3 is shown, however, the frame 3 of chamber 1 is replaced with a frame 3' rotatably mounted about shaft 4 and adapted to receive five supports S1–S5, each of which is identical to the three supports S1–S3, used in the conventional chamber.

For this purpose, the shafts, respectively A1 to A5 of supports S1 to S5 are, according to the present invention, mounted on five arms P1 to P5 of frame 3' and are oriented in such a way that the supports overlap. As shown in FIG. 5, the projections of secondary shafts A1 to A5 on a horizontal plane are inclined with respect to the radius of the circle defined by the tops of the supports by an angle $\alpha$. This angle is selected according to the dimension and the concavity of the supports so that the supports do not touch each other. The supports are rotatably mounted around the secondary shafts, the arms being inscribed in a cone which is coaxial to the first shaft so that the secondary shafts have a circular motion in a plane substantially perpendicular to the vertical shaft, including replacing the first plurality of arms by a second plurality of arms such that the supports overlap.

The degree of inclination of arms P1, P2, P3, P4 and P5 with respect to rotation shaft 4 of frame 3' is not modified with respect to a conventional installation, which allows the evaporation cone of source 6 not to be modified. Moreover, this allows for the use of conventional arms without modifying the rotatable coupling means between the transmission shafts (not shown) contained in these arms and, respectively, shaft 4 and secondary shafts A1, A2, A3, A4 and A5.

The rotating motions of frame 3' with respect to chamber 1 (arrow F1) and of supports S1, S2, S3, S4 and S5 about shafts A1, A2, A3, A4 and A5, respectively, (arrows F2) are thus not, according to the present invention, modified with respect to a conventional installation.

As is better illustrated by FIG. 4, the overlapping of the supports is organized, according to the present invention, so that the circumference of a support is as close as possible to the center of the next support. Thus, all areas of each support are, during an evaporation sequence, reached for a same duration by the evaporation cone. It will be appreciated, however, that the overlapping should not go beyond the center of the neighboring support, which would permanently mask an area of each support, which would, therefore, never receive the evaporated compound.

Thus, the implementation of the present invention results in the processing of a larger number of wafers in a single evaporation step, with only a slight increase of the duration of evaporation. This increase is very largely compensated by the reduction of the number of loading/unloading, vacuuming, heating, ventilating and cooling down steps which are necessary to process a batch of wafers. Indeed, the evaporation itself only represents around 10 to 30% of the duration of a total cycle. Thus, according to the present invention, the longest durations of the cycle are not modified. In the example shown in the drawings, the efficiency gain is around 50% with respect to a conventional installation.

Although reference has been made in the preceding description to an embodiment including five supports, the present invention applies, especially for an adaptation of an existing installation, to a higher or lower number of supports. For example, if the sizing of the supports is such that two supports face each other in the original installation, three of these supports can be placed in the chamber by implementing the present invention. If, in another example, four supports are present in an existing installation, six of these supports can be placed in the chamber by implementing the present invention.

Of course, the present invention is likely to have several alterations, modifications and improvements which will occur to those skilled in the art. In particular, the choice of the means used to organize the overlapping depends on the way in which the transmission of the rotating motions is organized.

Such alterations, modifications, and improvements are intended to be within the spirit and the scope of the present invention. Accordingly, the foregoing description is by way of example only and is not intended as limiting. The present invention is limited only as defined in the following claims and the equivalents thereto.

What is claimed is:

1. An evaporation installation comprising:
    a frame rotatably mounted about a first shaft;
    at least three arms supported by said frame, said arms each supporting a corresponding secondary shaft;
    at least three wafer supports, each support being rotatably mounted about one of said secondary shafts wherein said support each overlap a neighboring support.

2. The installation of claim 1, wherein said supports each include a top portion, a circumference and a center.

3. The installation of claim 2, wherein said secondary shafts are disposed such that the circumference of each of said supports is adjacent the center of said neighboring support.

4. The installation of claim 2, wherein said supports overlap such that the top portions of said supports together define a circle.

5. The installation of claim 4, wherein said secondary shafts are disposed at an angle with respect to the radius of the circle, such that said supports do not contact each other.

6. The evaporation installation of claim 1, wherein said first shaft is vertically mounted from an upper wall of a chamber containing an evaporation source.

7. The evaporation installation of claim 1, wherein the installation includes five supports.

8. An evaporation installation comprising:
    a plurality of supports, each of said supports being rotatably mounted about a corresponding shaft and having a circumference and a center point, wherein a portion of the circumference of each support overlaps a neighboring support up to, but not past, the center point of said neighboring support.

9. The evaporation installation of claim 8, wherein said supports are each spaced from said neighboring supports.

10. The evaporation installation of claim 8, further comprising a frame rotatably mounted about a first shaft and a plurality of arms supported by the frame, each of said plurality of arms supporting one of said corresponding shafts.

11. The evaporation installation of claim 8, wherein said supports each include a top portion.

12. The installation of claim 11, wherein said supports overlap such that the top portions of said supports together define a circle.

13. The installation of claim 12, wherein said secondary shafts are disposed at an angle with respect to the radius of the circle, such that said supports do not contact each other.

14. The evaporation installation of claim 10, wherein said first shaft is vertically mounted from an upper wall of a chamber containing an evaporation source.

15. A method for increasing the processing capacity of an evaporation installation comprising the steps of:

providing a frame rotatably mounted about a first shaft, the frame having a plurality of secondary shafts supported thereon;

providing a plurality of wafer supports to be processed; and rotatably mounting each of said plurality of wafer supports about a corresponding secondary shaft such that each of said supports overlaps a neighboring support.

16. An evaporation installation comprising:

a chamber containing an evaporation source; and means for overlapping a plurality of wafer supports disposed within said chamber.

17. The evaporation installation of claim 16, wherein said plurality of wafer supports are each rotatably mounted about respective shafts.

18. The evaporation installation of claim 17, wherein said shafts are disposed such that said plurality of wafer supports do not contact each other.

19. A method for increasing the processing capacity of an evaporation installation including a plurality of shafts comprising the step of:

rotatably mounting each of a plurality of supports about a corresponding shaft such that each of said supports overlaps a neighboring support.

20. The method according to claim 19, further comprising the step of:

inclining each of said shafts at an angle, such that said supports do not contact each other.

* * * * *